United States Patent
Chen

(10) Patent No.: US 7,260,515 B2
(45) Date of Patent: Aug. 21, 2007

(54) METHOD AND APPARATUS FOR SIMULATING TRANSPARENT LATCHES

(75) Inventor: Liang T. Chen, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 847 days.

(21) Appl. No.: 10/109,377

(22) Filed: Mar. 28, 2002

(65) Prior Publication Data

US 2003/0036893 A1 Feb. 20, 2003

Related U.S. Application Data

(60) Provisional application No. 60/313,762, filed on Aug. 20, 2001.

(51) Int. Cl.
| | |
|---|---|
| G06F 17/50 | (2006.01) |
| G01D 18/00 | (2006.01) |
| G01D 21/00 | (2006.01) |
| G01M 19/00 | (2006.01) |
| G01P 21/00 | (2006.01) |
| G01R 35/00 | (2006.01) |

(52) U.S. Cl. .................. 703/14; 703/19; 702/89; 702/124

(58) Field of Classification Search ........... 364/578, 364/488; 703/13–22, 23–28; 716/3, 4; 702/89, 702/124
See application file for complete search history.

(56) References Cited

U.S. PATENT DOCUMENTS

| | | | |
|---|---|---|---|
| 4,370,709 A * | 1/1983 | Fosdick .................. 703/26 |
| 5,095,454 A * | 3/1992 | Huang .................... 703/19 |
| 5,355,321 A * | 10/1994 | Grodstein et al. ......... 716/6 |
| 5,721,695 A * | 2/1998 | McMinn et al. .......... 703/14 |
| 5,740,347 A * | 4/1998 | Avidan ................. 714/33 |
| 5,866,904 A * | 2/1999 | Todokoro et al. ........ 250/310 |
| 5,886,904 A * | 3/1999 | Dai et al. ............. 703/14 |
| 5,923,564 A * | 7/1999 | Jones, Jr. ............. 716/6 |
| 6,081,656 A * | 6/2000 | Witt ................... 716/3 |
| 6,378,112 B1 * | 4/2002 | Martin et al. ........... 716/5 |
| 7,013,438 B1 * | 3/2006 | Saldanha et al. ......... 716/2 |
| 7,089,518 B2 * | 8/2006 | Bair et al. ............ 716/6 |
| 2003/0106029 A1 * | 6/2003 | Kishinevsky et al. ...... 716/4 |
| 2007/0061124 A1 * | 3/2007 | Van Huben et al. ....... 703/16 |

OTHER PUBLICATIONS

DeVance-C-J, Efficient circuit partitioning to extend cycle simulation beyond synchronous circuits, 1997, CPP Conference Paper.*
John F. Wakerly, Digital Design Principles & Practices, 2000, Prentice-Hall, 3rd edition, pp. 11,15-16.*
DeVance-C-J, Efficient circuit partitioning to extend cycle simulation beyond synchronous circuits, 1997, CPP Conference Paper.*

(Continued)

Primary Examiner—Kamini Shah
Assistant Examiner—David Silver
(74) Attorney, Agent, or Firm—Osha Liang LLP

(57) ABSTRACT

A method and apparatus for cycle-based simulation of a transparent latch includes classifying a phase of the transparent latch, classifying a phase of an input to the transparent latch, and classifying a phase of a simulation cycle. The transparent latch is simulated as a cycle-based simulation element based on the phase of the transparent latch, the phase of the input to the transparent latch, and the phase of the simulation cycle.

14 Claims, 18 Drawing Sheets

OTHER PUBLICATIONS

John F. Wakerly, Digital Design Principles & Practices, 2000, Prentice-Hall, 3rd edition, pp. 11,15-16.*

Joon-Seo Yim et al., "A C-Based RTL Design Verificatino Methodology for Complex Microprocessor", ACM, 1997.*

John F. Wakerly, Digital Design Principles & Practices, 2000, Prentice-Hall, 3rd edition, pp. 11,15-16.*

Joon-Seo Yim et al., "A C-Based RTL Design Verificatino Methodology for Complex Microprocessor", ACM, 1997.*

* cited by examiner

TABLE 1

| PHASE | CLK 1 | CLK 2 | CLK 3 |
|---|---|---|---|
| 1 | HIGH | HIGH | HIGH |
| 2 | HIGH | HIGH | LOW |
| 3 | HIGH | LOW | HIGH |
| 4 | LOW | HIGH | HIGH |
| 5 | HIGH | LOW | LOW |
| 6 | LOW | HIGH | LOW |
| 7 | LOW | LOW | HIGH |
| 8 | LOW | LOW | LOW |

FIGURE 7a

TABLE 2

| PHASE | TRANSPARENT LATCH (402) THROUGH TRANSPARENT LATCH (418) | TRANSPARENT LATCH (404) THROUGH TRANSPARENT LATCH (418) |
|---|---|---|
| 1 | TRANSPARENT | OPAQUE |
| 2 | OPAQUE | OPAQUE |
| 3 | TRANSPARENT | TRANSPARENT |
| 4 | OPAQUE | OPAQUE |
| 5 | OPAQUE | OPAQUE |
| 6 | OPAQUE | OPAQUE |
| 7 | OPAQUE | TRANSPARENT |
| 8 | OPAQUE | OPAQUE |

FIGURE 7b

METHOD AND APPARATUS FOR SIMULATING TRANSPARENT LATCHES

CROSS-REFERENCE TO RELATED APPLICATIONS

This application claims benefit of U.S. Provisional Application Ser. No. 60/313,762, filed Aug. 20, 2001, entitled "Phaser Compiler Related Inventions," in the names of Liang T. Chen, Jeffrey Broughton, Derek Pappas, William Lam, Thomas M. McWilliams, Ihao Chen, Ankur Narang, Jeffrey B. Rubin, Earl T. Cohen, Michael Parkin, Ashley Saulsbury, and David R. Emberson.

BACKGROUND OF INVENTION

To increase microprocessor performance, the number of circuit elements and clock frequencies used by microprocessors, often referred to as "CPUs", have increased. Also, as the number of circuits in a CPU has increased, the number of parallel operations has risen. Examples of efforts to create more parallel operations include increased pipeline depth and an increase in the number of functional units in superscalar and very-long-instruction-word architectures. As CPU performance continues to increase, the result has been a larger number of circuits switching at faster rates. Thus, from a design perspective, important considerations, such as the time needed to complete a simulation and the time needed to debug a CPU, must be taken into account.

As new CPU designs include more circuit elements, often operating at increased frequencies, the time required to simulate a CPU increases. Due to the increased time for simulation, the number of and breadth of tests, often referred to as "test coverage", decreases. The result has been an increase in the number of logic errors that escape detection before the CPU is manufactured.

After a CPU prototype is initially manufactured and failure modes are uncovered, the time required to determine the failure mechanisms is generally increasing due to the increased CPU complexity. Failure modes may be the result of logic errors or poor manufacturability of one or more circuit elements. Circuit simulation helps determine the existence of a logic error. If a logic error does not exist, the manufacturability of a circuit element may be the root cause. Even after a failure mechanism is discovered and a solution is proposed, the time required to satisfactorily determine that the proposed solution fixes the error and does not generate any new errors has increased. Circuit simulation is key to the design and debug of increasingly complex and faster CPUs.

CPU simulation may be performed at a "switch level". Switch level simulations typically include active circuit elements, for example transistors, and passive circuit elements that may include, for example, resistors, capacitors, and inductors. A switch level circuit simulator know in the art is SPICE, which is an acronym for Simulation Program with Integrated Circuit Emphasis. SPICE typically models each element using an equation or lookup table. SPICE can accurately model the voltage and/or current of each circuit element across time.

CPU simulation may also be performed at a "behavioral level". Behavioral level simulations typically use a hardware description language (HDL) that determine the functionality of a single circuit element or group of circuit elements. A behavioral level simulation language known in the art is Verilog, which is a standard language published by the Institute of Electrical and Electronics Engineers, Piscataway, N.J. Verilog uses a high level programming language to describe the relationship between the input and output of one or more circuit elements. Verilog describes on what conditions the outputs should be modified and what effect the inputs have. Verilog programs may also be used for logic simulations at the "register transfer level" (RTL).

HDL languages, such as Verilog, are designed for the efficient representation of hardware designs. Verilog has support for handling signals of arbitrary widths; not only for defining and using an arbitrary width signal, but for treating any sub-field of such a signal as a signal in its own right.

HDL simulations may be event driven or cycle-based. Event driven simulations propagate a change in state from one set of circuit elements to another. Event driven simulators may record relative timing information of the change in state so that timing and functional correctness may be verified. Cycle-based HDL simulations also simulate a change in state from one set of circuit elements to another. Cycle-based HDL simulations, however, evaluate the state of the system once at the end of each clock cycle. While specific intra-cycle timing information is not available, simulation speed is improved. Discrete component evaluations and re-evaluations are typically unnecessary upon the occurrence of every event.

Cycle-based simulations operate by evaluating the state of the circuit elements on clock transitions. State information is maintained from one cycle to the next by a state device. One example of a state device is a flip-flop. A flip-flop modifies its output to equal its input on a clock transition, for example, a low to high clock transition. Flip-flops are often connected to combinatorial logic. The combinatorial logic modifies the output from several flip-flops and creates a new input into another flip-flop. This sequential arrangement of flip-flop to combinatorial logic to flip-flop allows computations to occur and be temporarily stored within a single clock cycle. This arrangement also allows multiple combinatorial logic blocks to operate in parallel.

The behavior of flip-flops coupled with combinatorial logic is ideal for cycle-based simulation because a change in state may only propagate to the next flip-flop. The flip-flop will propagate the change in state only on the next clock transition. Cycle-based simulation records a change in state only on a clock transition, which corresponds to the time a flip-flop modifies the state of the simulation.

In FIG. 1a, for example, flip-flops (52, 54) update their respective outputs (57, 59) with their respective inputs, IN 1 (51) and IN 2 (53), when a low to high transition occurs on CLK (55). This change is drawn in a timing diagram in FIG. 1b. Outputs (57, 59) are inputs to a combinatorial logic cone (56). The combinatorial logic cone (56) is representative of any combination of combinatorial logic elements. Combinatorial logic elements include, but are not limited to, any elements that provide Boolean logic functionality. The cone structure refers to an arrangement where more inputs exist than outputs, hence a "cone" structure. In this example, the combinatorial logic cone (56) may respond to one or both of the inputs. A combinatorial logic cone output (61) is designed to arrive at flip-flop (58) before the CLK (55) transitions from high to low. The high to low transition of CLK (55) causes flip-flop (58) to update flip-flop output OUT 3 (63) with the combinatorial logic cone output (61) as drawn in the timing diagram in FIG. 1b.

A clock transition on which a change in the state of the system occurs is defined as a "phase". In FIG. 1a, the low to high transition of CLK (55) is referred to as phase A. The high to low transition of CLK (55) is referred to as phase B. Any logical element that may change state due to the transition of an associated clock is referred to by the phase of the clock transition. For example, flip-flops (52, 54) and respective outputs (57, 59) change when CLK (55) transitions from low to high; therefore, they are classified as phase A. All inputs to combinatorial logic cone (56) are from phase A; therefore, the combinatorial logic cone output (61) is classified as phase A. Flip-flop (58) and output (63) change when CLK (55) transitions from high to low; therefore, they are classified as phase B.

The behavior of flip-flops is ideal for cycle-based simulation because a change in state may only occur on a clock transition. Other types of latches, for example a transparent latch, may change its output so long as a clock input signal to the transparent latch remains at an active level. Cycle-based simulators are not typically arranged to simulate a transparent latch.

SUMMARY OF INVENTION

According to one aspect of the present invention, a method for cycle-based simulation of a transparent latch comprises classifying a phase of the transparent latch, classifying a phase of an input to the transparent latch, classifying a phase of a simulation cycle, and simulating the transparent latch as a cycle-based simulation element amenable to cycle-based simulation based on the phase of the transparent latch, the phase of the input to the transparent latch, and the phase of the simulation cycle.

According to one aspect of the present invention, a computer system for cycle-based simulation of a transparent latch comprises a processor, a memory, and software instructions stored in the memory adapted to cause the computer system to perform classifying a phase of the transparent latch, classifying a phase of an input to the transparent latch, classifying a phase of a simulation cycle, and simulating the transparent latch as a cycle-based simulation element amenable to cycle-based simulation based on the phase of the transparent latch, the phase of the input to the transparent latch, and the phase of the simulation cycle.

According to one aspect of the present invention, a computer-readable medium having recorded thereon instructions executable by a processor, the instructions adapted to perform classifying a phase of a transparent latch, classifying a phase of an input to the transparent latch, classifying a phase of a simulation cycle, and simulating the transparent latch as a cycle-based simulation element amenable to cycle-based simulation based on the phase of the transparent latch, the phase of the input to the transparent latch, and the phase of the simulation cycle.

Other aspects and advantages of the invention will be apparent from the following description and the appended claims.

BRIEF DESCRIPTION OF DRAWINGS

FIG. 1b shows a timing diagram for the typical computer system component shown in FIG. 1a.

FIG. 7a shows an example table for use in classifying the simulation cycle phase in accordance with an embodiment of the present invention.

FIG. 7b shows an example table for use in classifying the behavior of transparent latches in multiple clock domains in accordance with an embodiment of the present invention.

DETAILED DESCRIPTION

Figure 1A:
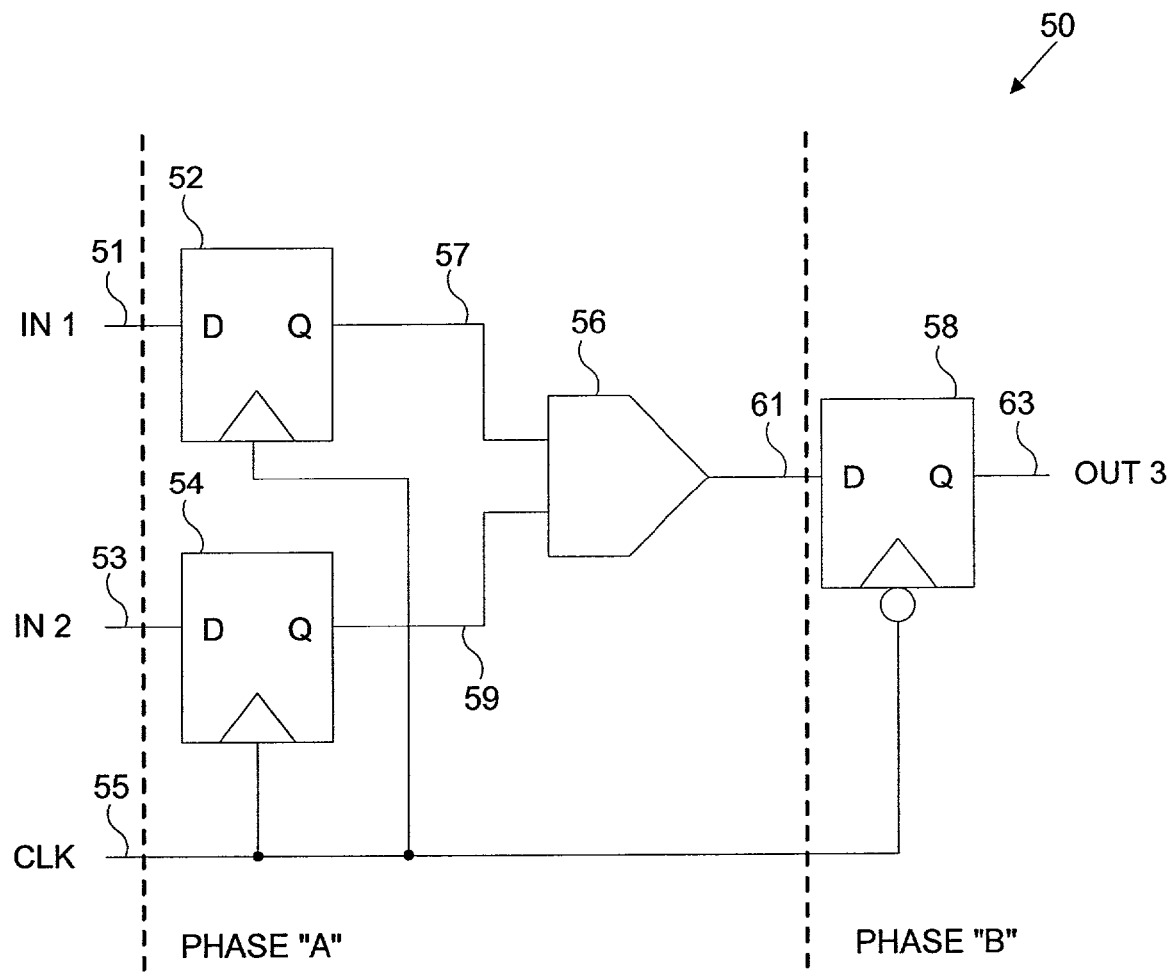
FIG. 1a shows a section of a typical computer system component.
Figure 1B:
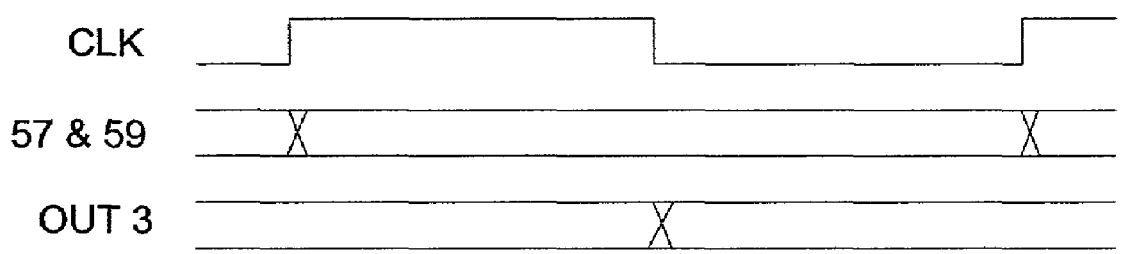

Embodiments of the present invention relate to a method for cycle-based simulations of a transparent latch. Embodiments of the present invention further relate to a computer system for cycle-based simulation of a transparent latch. Embodiments of the present invention further relate to a computer-readable medium having recorded thereon instructions executable by a processor for cycle-based simulation of a transparent latch.

Exemplary embodiments of the invention will be described with reference to the accompanying drawings. Like items in the drawings are shown with the same reference numbers.

More particularly, embodiments of the present invention relate to simulation of a transparent latch in a cycle-based simulation environment. Cycle-based simulations evaluate the state of the circuit elements on a clock transition. A transparent latch output, however, may change so long as a clock input signal to the transparent latch remains at an active level. An arrangement to simulate a transparent latch in a cycle-based simulator is presented.

Figure 2A:
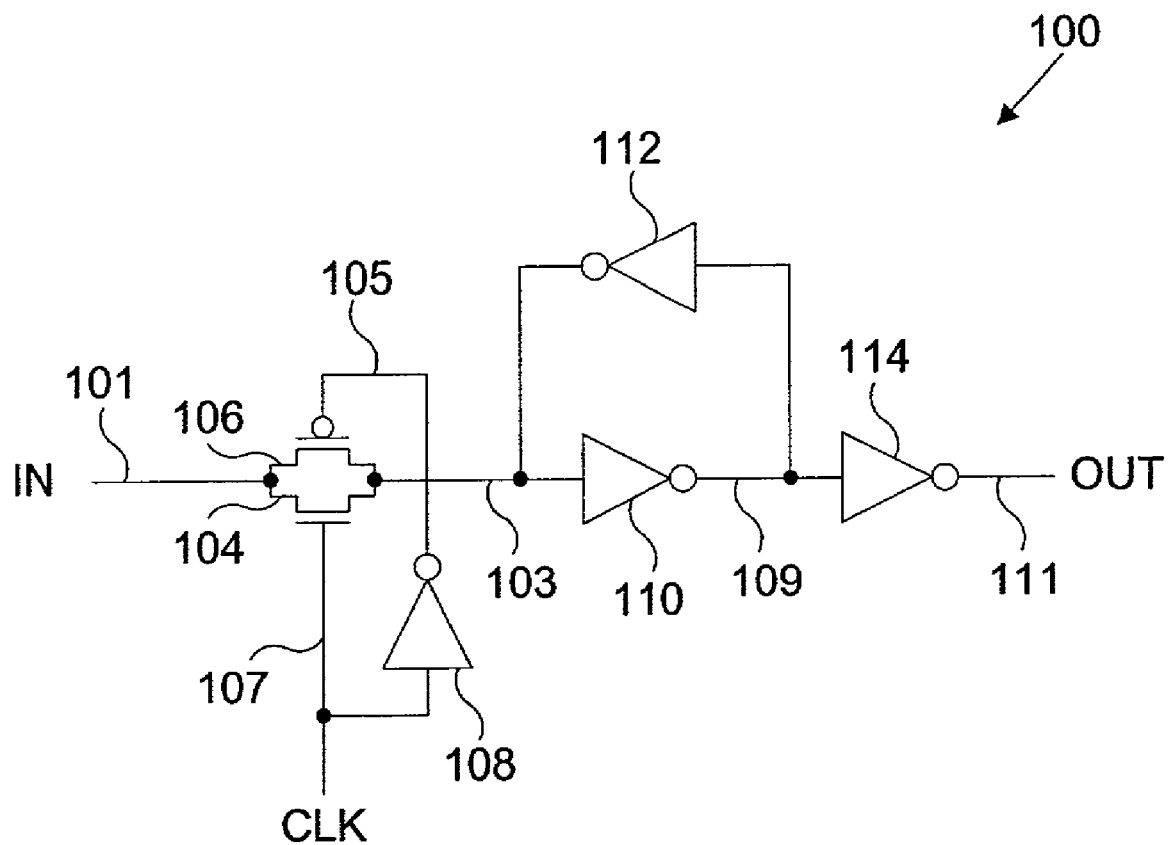
FIG. 2a shows a positive polarity transparent latch circuit.

FIG. 2a shows an example of a positive polarity transparent latch (100). An input IN (101) is input to a pass gate formed from a p-channel device (106) and a n-channel device (104). The gates of the p-channel device (106) and n-channel device (104) are driven by signal line (105) and CLK (107), respectively. The pass gate is arranged so that IN (101) is allowed to pass through the pass gate when CLK (107) is at a high potential. CLK (107) is inverted by inverter (108) to generate a low potential on signal line (105) when CLK (107) is at a high potential. The p-channel device (106) conducts when CLK (107) is at a high potential, as is the n-channel device (104). Both the p-channel device (106) and n-channel device (104) are non-conducting when CLK (107) is at a low potential.

Input IN (101) is transferred to signal line (103) when the pass gate conducts. Signal line (103) is input to a three inverter (110, 112, 114) arrangement that holds the state of the signal line (103). Inverters (110, 112) are feed back on each other such that the inversion of the state on signal line (103) is maintained on signal line (109). Inverter (112) is a weak device. Because the input IN (101) is driven onto signal line (103) when the p-channel device (106) and n-channel device (104) are conducting, signal line (103) can override the signal from the output of inverter (112). Signal line (109) is inverted by inverter (114) to produce the state of signal line (103) on output OUT (111). Transparent latch (100) differs from the operation of the flip-flop described above in that IN (101) is allowed to propagate through the transparent latch (100) while CLK (107) is at a high potential. While CLK (107) is at a low potential, the transparent latch is "opaque". In other words, IN (101) is not allowed to propagate through the pass gate, and the last state of IN (101), as CLK (107) transitioned from a high to low potential, is maintained at OUT (111).

Figure 2B:
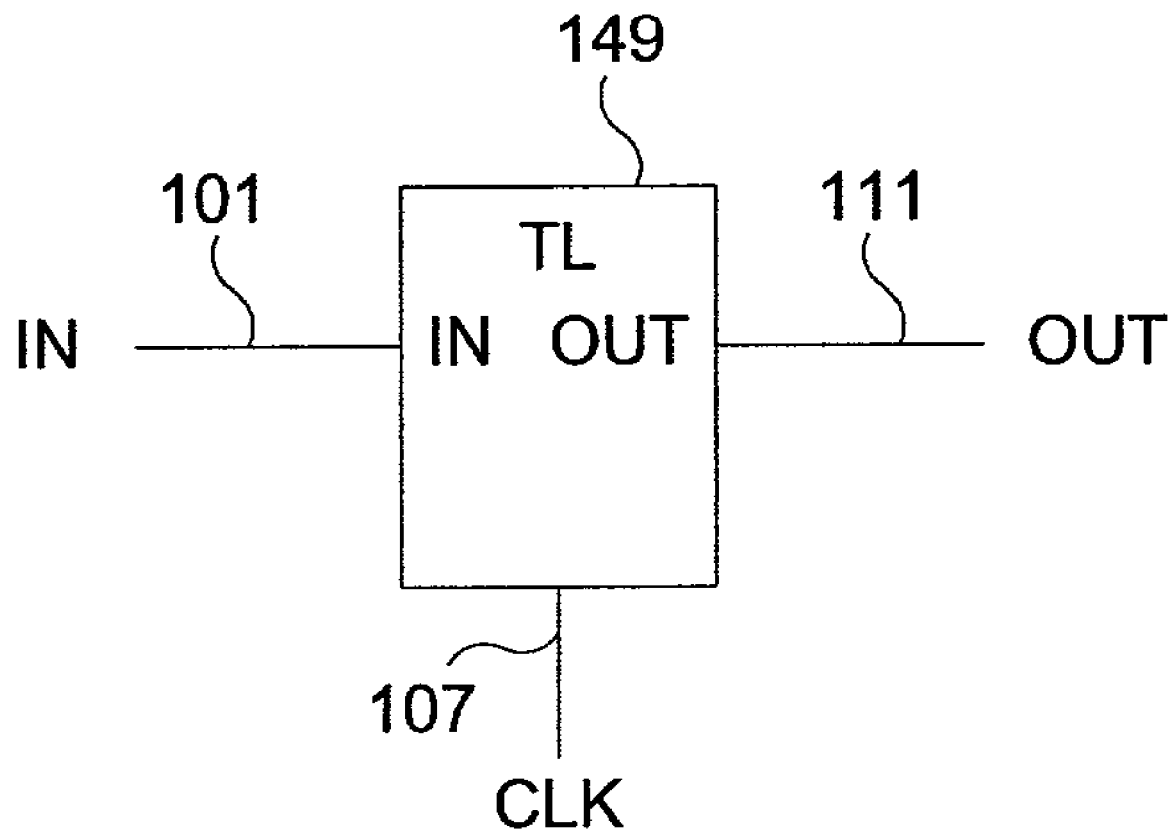
FIG. 2b shows a positive polarity transparent latch block diagram.
Figure 2C:
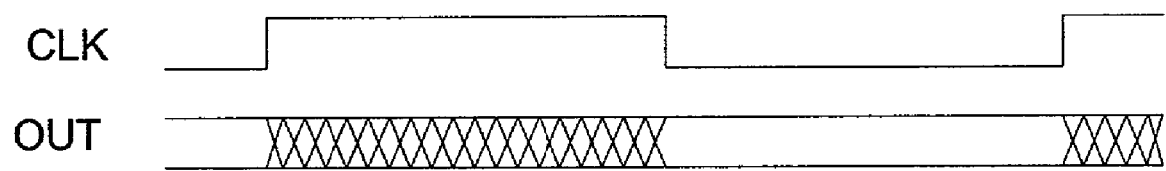
FIG. 2c shows a positive polarity transparent latch timing diagram.

In FIG. 2b, a block diagram (149) represents the positive polarity transparent latch (100) described above. The functionality of the positive polarity transparent latch (100) is also drawn in a timing diagram in FIG. 2c.

Figure 2D:
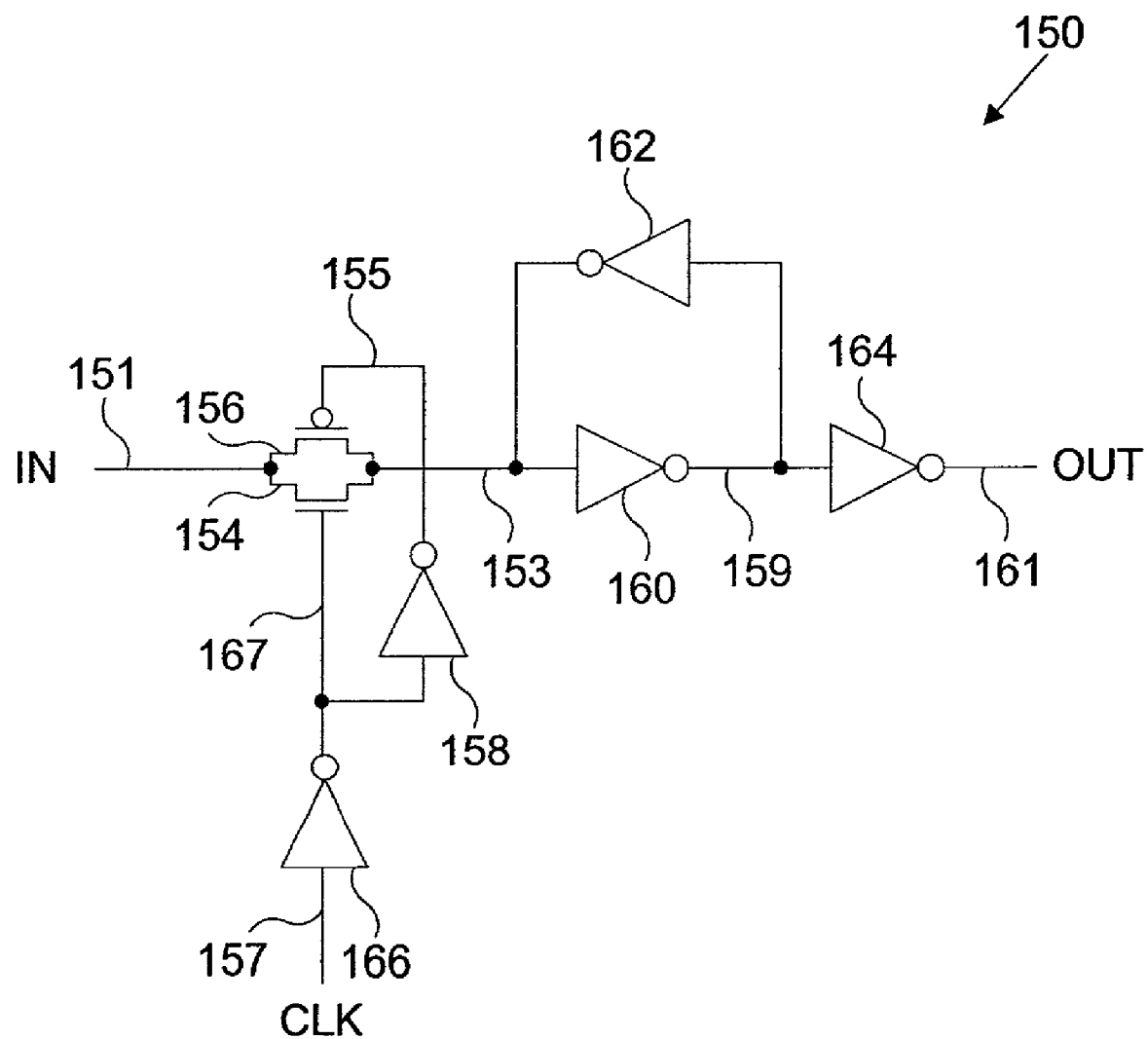
FIG. 2d shows a negative polarity transparent latch circuit.

FIG. 2d shows an example of a negative polarity transparent latch (150). An input IN (151) is input to a pass gate formed from p-channel device (156) and n-channel device (154). The gates of the p-channel device (156) and n-channel device (154) are driven by signal line (155) and signal line (167), respectively. The pass gate is arranged so that IN (151) is allowed to pass through the pass gate when CLK (157) is at a low potential. CLK (157) is inverted by inverter (166) to generate a high potential on signal line (167) when CLK (157) is at a low potential. Signal line (167) is inverted by inverter (158) to generate a low potential on signal line (155) when signal line (167) is at a high potential. The p-channel device (156) conducts when CLK (157) is at a low potential, as is the n-channel device (154). Both the p-channel device (156) and n-channel device (154) are non-conducting when CLK (157) is at a high potential.

Input IN (151) is transferred to signal line (153) when the pass gate conducts. Signal line (153) is input to a three inverter (160, 162, 164) arrangement that holds the state of the signal line (153). Inverters (160, 162) are feed back on each other such that the inversion of the state on signal line (153) is maintained on signal line (159). Inverter (162) is a weak device. Because the input IN (151) is driven onto signal line (153) when the p-channel device (156) and n-channel device (154) are conducting, signal line (153) can override the signal from the output of inverter (162). Signal line (159) is inverted by inverter (164) to produce the state of signal line (153) on output OUT (161). Transparent latch (150) differs from the operation of the flip-flop described above in that IN (151) is allowed to propagate through the transparent latch (150) while CLK (157) is at a low potential. While CLK (157) is at a high potential, the transparent latch is "opaque". In other words, IN (151) is not allowed to propagate through the pass gate, and the last state of IN (151), as CLK (157) transitioned from a low to high potential, is maintained at OUT (161).

Figure 2E:
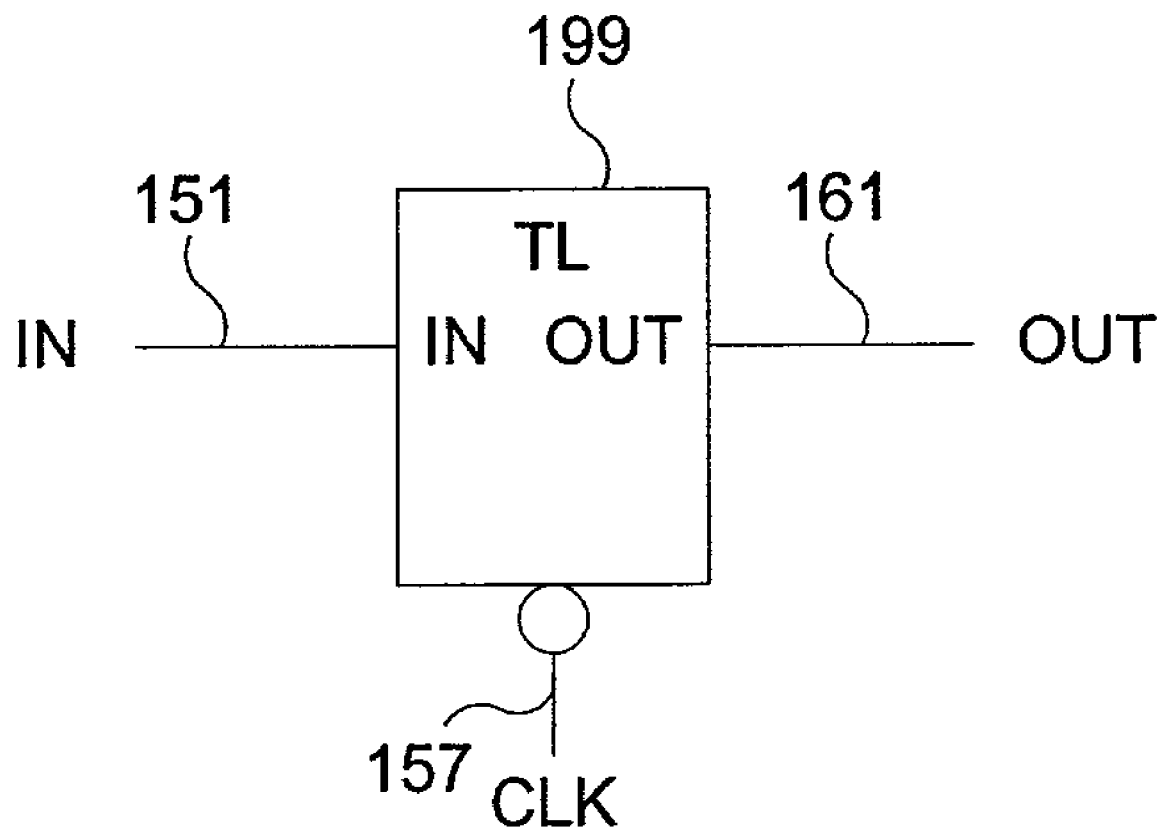
FIG. 2e shows a negative polarity transparent latch block diagram.
Figure 2F:
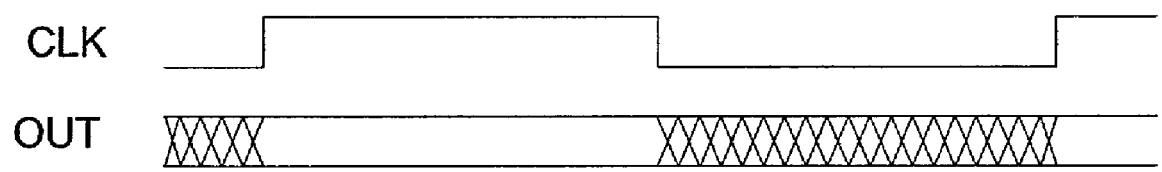
FIG. 2f shows a negative polarity transparent latch timing diagram.

In FIG. 2e, a block diagram (199) represents the negative polarity transparent latch (150) described above. The functionality of the negative polarity transparent latch (150) is also drawn in a timing diagram in FIG. 2f.

Those skilled in the art will appreciate that a transparent latch allows the input to propagate to the output when an associated clock remains at an active level. This condition is referred to as "transparent." When the associated clock is not at an active level, the transparent latch maintains the last transparent latch output from when the associated clock was at an active level. This condition is referred to as "opaque." The circuit of a transparent latch may be any one of a variety of designs.

Referring to FIG. 2b and FIG. 2e, transparent latches (149, 199) may be used as a circuit element in the design of a CPU. Because the output OUT (111) of transparent latch (149) is allowed to transition any time CLK (107) is high, it does not follow the general design requirements of a cycle-based simulation. Because the output OUT (161) of transparent latch (199) is allowed to transition any time CLK (157) is low, it does not follow the general design requirements of a cycle-based simulation. Cycle-based simulations operate by evaluating the state of the circuit elements only on a clock transition. Circuit elements such as transparent latches (149, 199) allow the state of the information to change at times other than on a clock transition. To be able to simulate transparent latches (149, 199) in a cycle-based simulation, the behavior of the transparent latch may be modeled with circuit elements that transition only on a clock transition edge.

The following description is based on a single clock source in the design (single clock domain design).

To perform cycle-based simulation of transparent latches, a phase of a clock may be classified. The input clock of a state device may come from a clock source network or an output of a logic element operatively connected to the clock source network. A phase A clock is defined as a clock that is not inverted from the original clock source. A phase B clock is defined as a clock that is inverted from the original clock source.

A phase of a simulation cycle may also be classified. The phase of the simulation cycle is caused by a clock edge event during simulation time advancement. A low to high clock transition may be referred to as phase A simulation cycle. A high to low clock transition may be referred to as phase B simulation cycle.

A phase of a state device may be determined by classifying the phase of the clock connected to the state device. A state device maintains a state of some part of a system for a limited time. State devices include, but are not limited to, flip-flops, transparent latches, and edge triggered devices. Positive polarity state devices that are associated with the phase A clock are in phase A. A positive polarity state device is an element that responds to a rising edge or high state associated with the original clock source. Positive polarity state devices that are associated with the phase B clock are in phase B. A negative polarity state device is an element that responds to a falling edge or low state associated with the original clock source. Negative polarity state devices that are associated with the phase A clock are in phase B. Negative polarity state devices that are associated with the phase B clock are in phase A.

The combinatorial logic cone may be classified by the phase of its inputs. If all inputs to the combinatorial logic cone are from phase A state devices, the combinatorial logic cone is phase A. If all inputs to the combinatorial logic cone are from phase B state devices, the combinatorial logic cone is phase B. If the inputs to the combinatorial logic cone are from both phase A and phase B state devices, the combinatorial logic cone is mixed phase.

Three example circuits and associated modeling rules are provided in FIGS. 3a, 3b, 4a, 4b, 5a, and 5b for single clock domain designs.

Figure 3A:
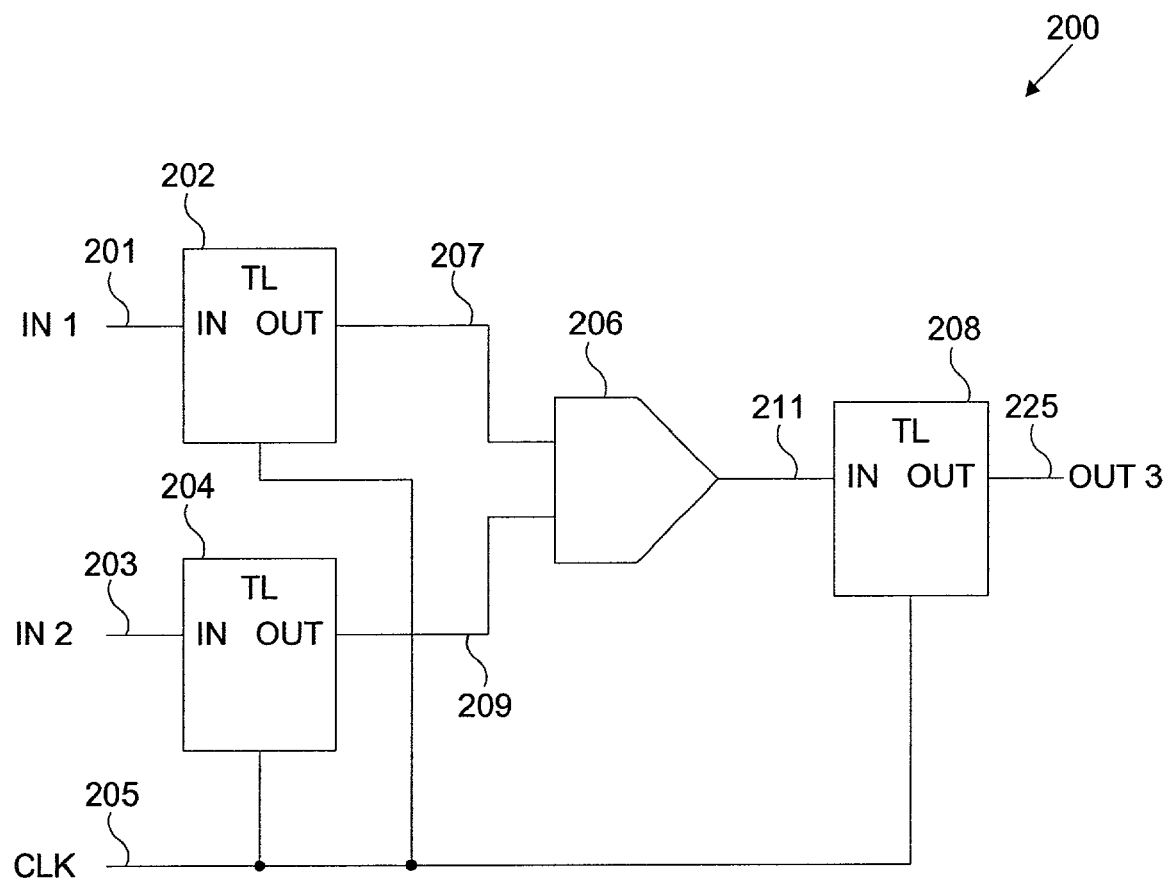
FIG. 3a shows an example circuit diagram of a transparent latch driven by the same phase source latches in accordance with an embodiment of the present invention.

FIG. 3a shows an exemplary circuit diagram (200) in accordance with an embodiment of the present invention. The circuit diagram (200) is representative of a circuit that may require cycle-based simulation. Transparent latches (202, 204) may update their respective outputs (207, 209) with their respective inputs IN 1 (201) and IN 2 (203) while a high signal occurs on CLK (205). The outputs (207, 209) are inputs into combinatorial logic cone (206). Combinatorial logic cone output (211) is designed to arrive at transparent latch (208) before CLK (205) transitions from high to low. Transparent latch (208) may update its output OUT 3 (225) while a high signal occurs on CLK (205).

Because transparent latches (202, 204) may modify their respective outputs (207, 209) while a high signal occurs on CLK (205), they are positive polarity state devices. Transparent latches (202, 204) are associated with the phase A clock, CLK (205); therefore, they are in phase A. Combinatorial logic cone (206) may respond to one or both of the inputs. Because transparent latches (202, 204) and their associated outputs (207, 209) are both phase A, and are the only inputs into the combinatorial logic cone (206), combinatorial logic cone (206) is in phase A. Because transparent latch (208) may update its output OUT 3 (225) while a high signal occurs on CLK (205), it is a positive polarity state device. The transparent latch (208) and its output OUT 3 (225) are in phase A because latch (208) is associated with the phase A clock, CLK (205).

Figure 3B:
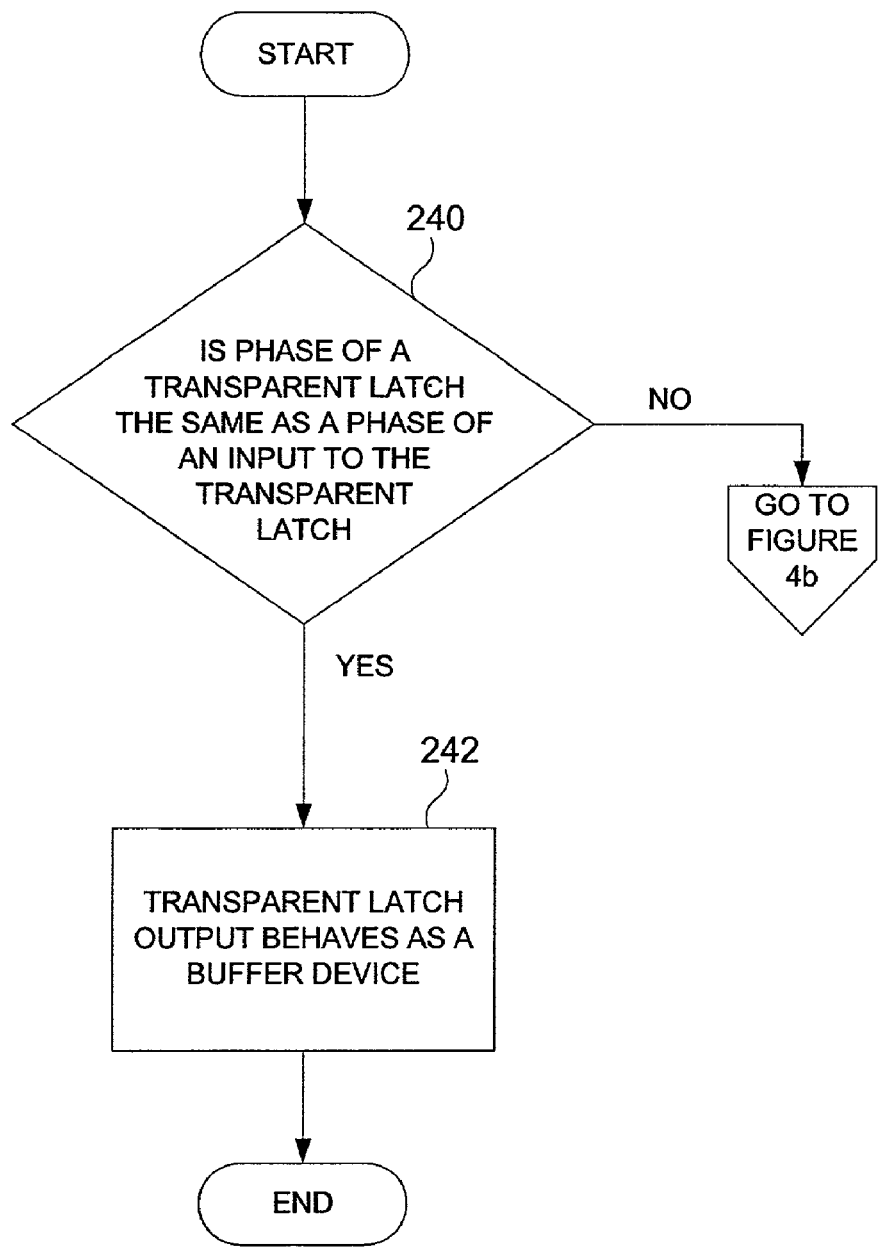
FIG. 3b shows an example flow diagram of classifying a transparent latch which behaves as a buffer device in accordance with an embodiment of the present invention.

FIG. 3b provides an exemplary flow diagram of a method for modeling a transparent latch (such as 208 in FIG. 3a) in a cycle-based simulation. Decision block (240) requires that the phase of transparent latch (208 in FIG. 3a) be classified. Transparent latch (208 in FIG. 3a) responds to CLK (205 in FIG. 3a) being high; therefore, transparent latch (208 in FIG. 3a) is a positive polarity state device. CLK (205 in FIG. 3a) is not inverted from the original clock source; therefore, CLK (205 in FIG. 3a) is in phase A. Because transparent latch (208 in FIG. 3a) is a positive polarity state device associated with a phase A clock, transparent latch (208 in FIG. 3a) is in phase A. Next, decision block (240) requires that the input to transparent latch (208 in FIG. 3a) be classified. Because the combinatorial logic cone is phase A, the outcome from decision (240) flows to (242). The transparent latch (208 in FIG. 3a) may be modeled as a buffer device.

Those skilled in the art will appreciate that a buffer device may be an element in which the output state is made equal to the input state. Any logic element that provides this functionality may be used in a simulation.

Referring again to FIG. 3a, during the phase A simulation cycle (or high CLK (205) state), transparent latch (208) is transparent. During the phase B simulation cycle (or low CLK (205) state), transparent latches (202, 204, 208) are all opaque. Because combinatorial logic cone (206) is the same phase as the transparent latch (208) that is being modeled, the output (211) from the combinatorial logic cone (206) will not change. Because the output (211) does not change, transparent latch (208) may still be modeled as a buffer device. Because equality between the output OUT 3 (225) and output (211) exists without regard to time, the output may be equated to the input without reference to an intervening logic element. Essentially, the transparent latch (208) may be removed from the simulation.

Figure 4A:
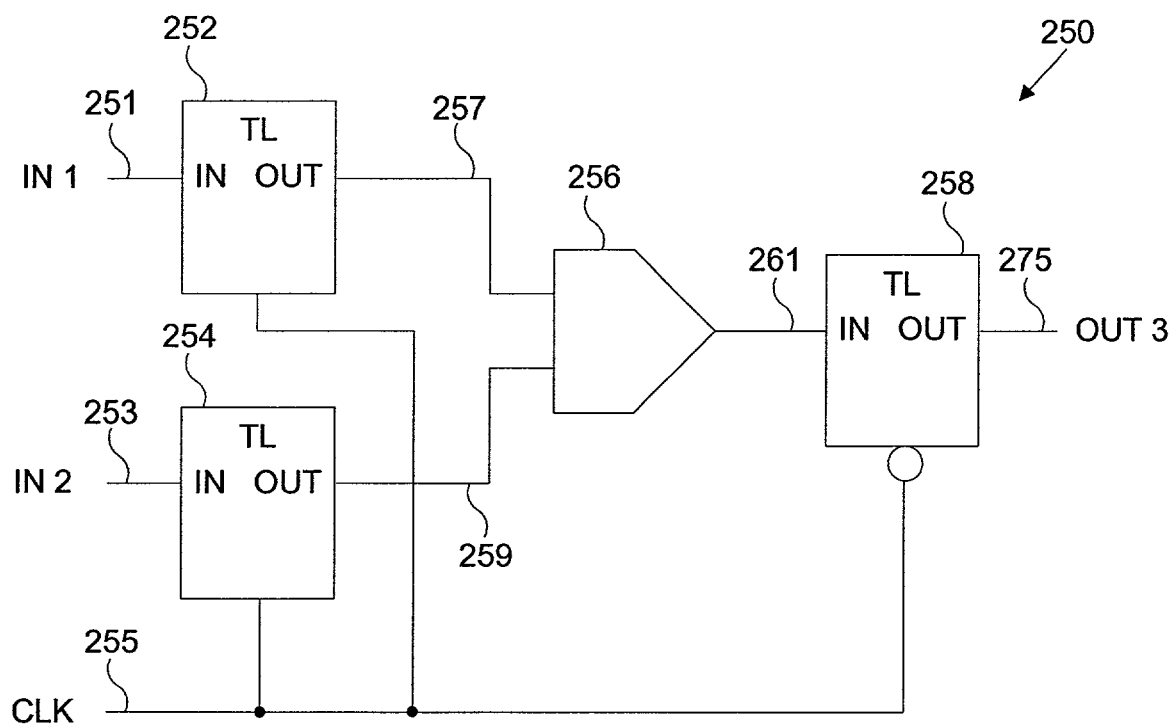
FIG. 4a shows an example circuit diagram of a transparent latch driven by the opposite phase source latches in accordance with an embodiment of the present invention.

FIG. 4a shows an exemplary circuit diagram (250) in accordance with an embodiment of the present invention. The circuit diagram (250) is representative of a circuit that may require cycle-based simulation. Transparent latches (252, 254) may update their respective outputs (257, 259) with their respective inputs IN 1 (251) and IN 2 (253) while a high signal occurs on CLK (255). The outputs (257, 259) are inputs into combinatorial logic cone (256). Combinatorial logic cone output (261) is designed to arrive at transparent latch (258) before CLK (255) transitions from high to low. Transparent latch (258) may update its output OUT 3 (275) while a low signal occurs on CLK (255).

Because transparent latches (252, 254) may modify their respective outputs (257, 259) while a high signal occurs on CLK (255), they are positive polarity state devices. Transparent latches (252, 254) are associated with the phase A clock, CLK (255); therefore, they are in phase A. Combinatorial logic cone (256) may respond to one or both of the inputs. Because transparent latches (252, 254) and their associated outputs (257, 259) are both phase A, and are the only inputs into the combinatorial logic cone (256), combinatorial logic cone (256) is in phase A. Because transparent latch (258) may update its output OUT 3 (275) while a low signal occurs on CLK (255), it is a negative polarity state device. The transparent latch (258) and output OUT 3 (275) are in phase B because it is associated with the phase A clock, CLK (255).

Figure 4B:
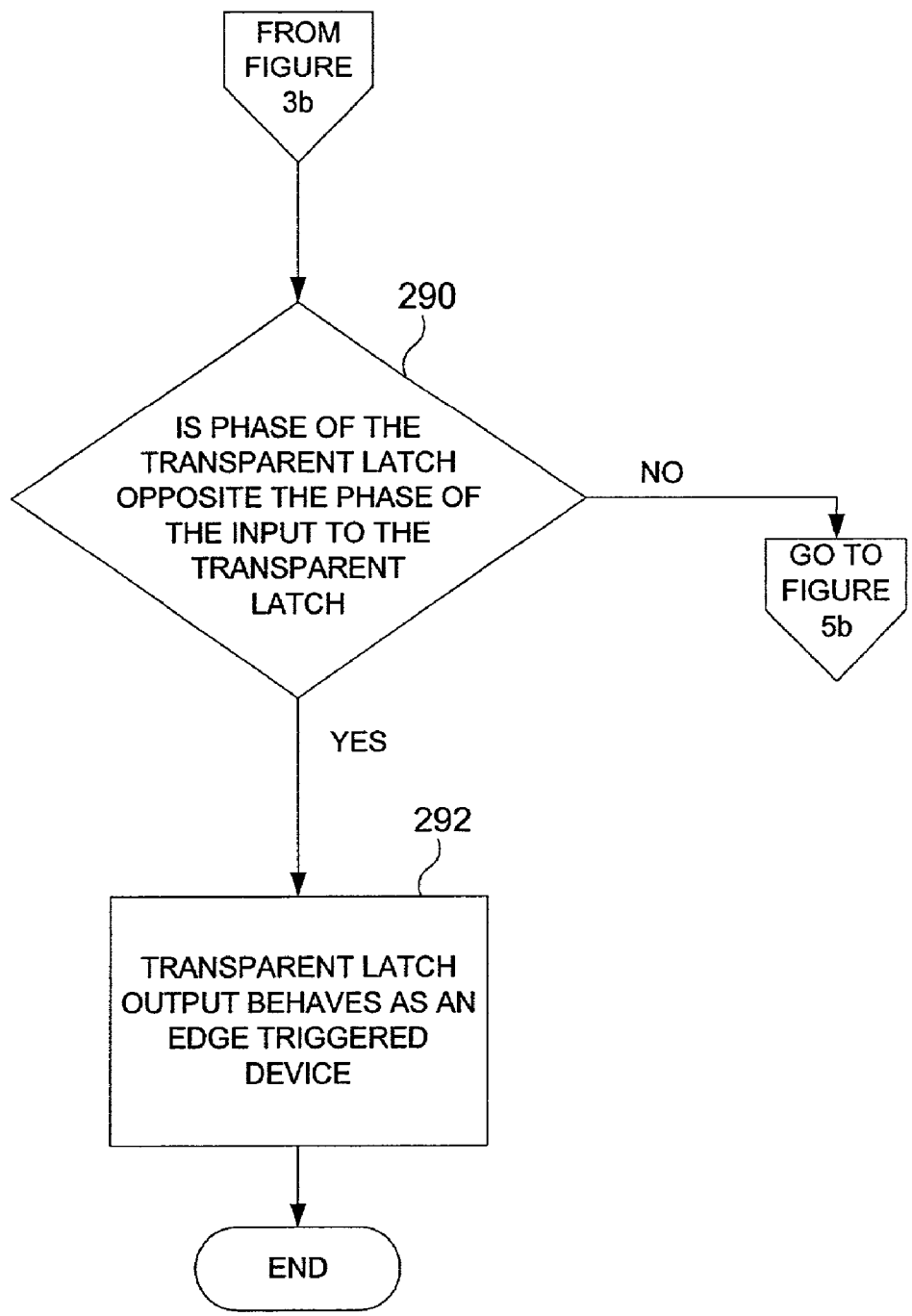
FIG. 4b shows an example flow diagram of classifying a transparent latch that behaves as an edge triggered device in accordance with an embodiment of the present invention.

FIG. 4b provides an exemplary flow diagram to model transparent latch (258 in FIG. 4a) in a cycle-based simulation. In decision block (290) the phase of transparent latch (258 in FIG. 4a) is classified. Transparent latch (258 in FIG. 4a) responds to CLK (255 in FIG. 4a) being low. Transparent latch (258 in FIG. 4a) is a negative polarity state device. CLK (255 in FIG. 4a) is not inverted from the original clock source; therefore, CLK (255 in FIG. 4a) is in phase A. Because transparent latch (258 in FIG. 4a) is a negative polarity state device associated with a phase A clock, transparent latch (258 in FIG. 4a) is in phase B. Next, decision block (290) requires that the input to transparent latch (258 in FIG. 4a) be classified. Because the combinatorial logic cone is phase A, the outcome from decision (290) flows to (292). The transparent latch (258 in FIG. 4a) may be modeled as an edge triggered device.

Those skilled in the art will appreciate that an edge triggered device may be an element in which its output state is made equal to its input state when a clock transitions, or a clock edge, is encountered.

Referring again to FIG. 4a, during the phase A simulation cycle (or high CLK (255) state), transparent latch (258) is opaque; therefore, output OUT 3 (275) does not change. Transparent latches (252, 254) are transparent during the phase A simulation cycle; therefore, the combinatorial logic cone (256) may update its output (261). During the phase B simulation cycle (or low CLK (255) state), transparent latches (252, 254) are opaque, while transparent latch (258) is transparent. Because the combinatorial logic cone (256) may only modify its output (261) during the phase A simulation cycle, any modification to output OUT 3 (275) only occurs on the falling edge of CLK (255). Transparent latch (258) may be modeled as a falling edge triggered device. A transparent latch that follows the flow diagram in FIG. 4b will be a falling edge triggered device if the transparent latch is in phase B.

The above example may be modified such that the two transparent latches (252, 254) are negative polarity state devices, and transparent latch (258) is a positive polarity state device. In flow diagram 4b the input to transparent latch (258 in FIG. 4a), being of an opposite phase than the transparent latch (258 in FIG. 4a), results in the transparent latch (258 in FIG. 4a) being able to be modeled as an edge triggered device. In this embodiment, however, transparent latch (258 in FIG. 4a) may be modeled as a rising edge triggered device because it is in phase A. A transparent latch that follows the flow diagram in FIG. 4b will be a rising edge triggered device if the transparent latch is in phase A.

Figure 5A:
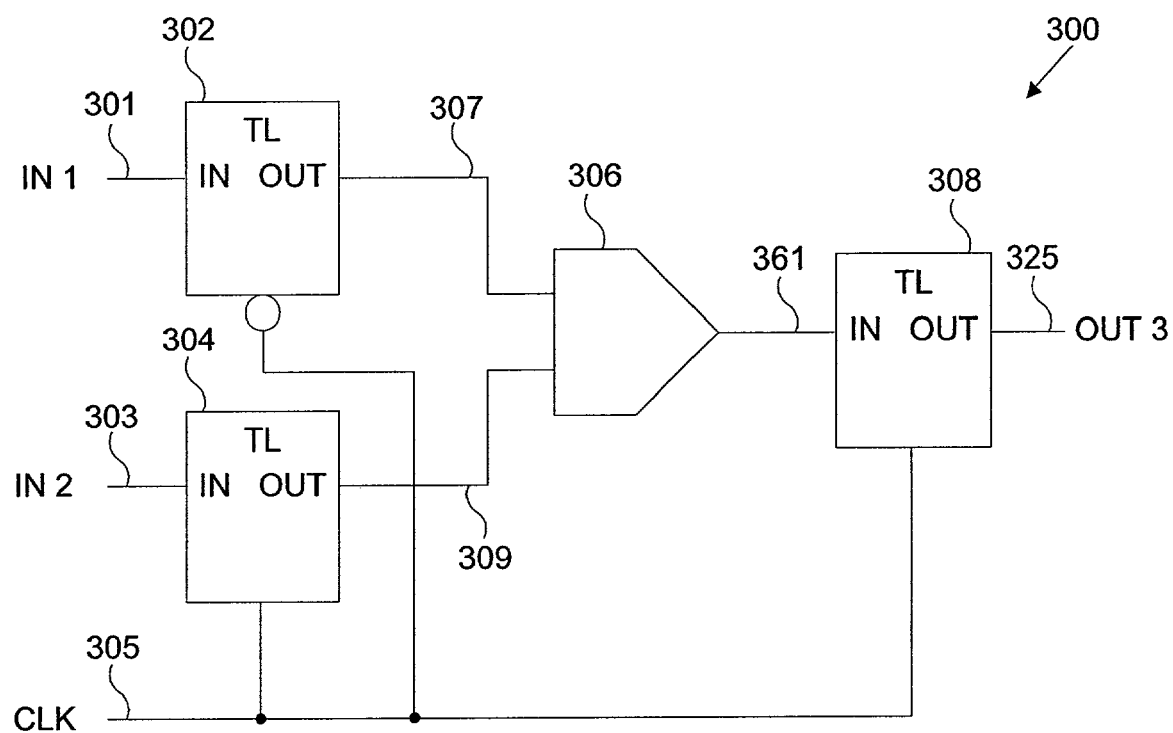
FIG. 5a shows an example circuit diagram of a transparent latch driven by mixed phase source latches in accordance with an embodiment of the present invention.

FIG. 5a shows an exemplary circuit diagram (300) in accordance with an embodiment of the present invention. The circuit diagram (300) is representative of a circuit that may require cycle-based simulation. Transparent latch (302) may update its output (307) with its input IN 1 (301) while a low signal occurs on CLK (305). Transparent latch (304) may update its output (309) with its input IN 2 (303) while a high signal occurs on CLK (305). The outputs (307, 309) are inputs into combinatorial logic cone (306). Combinatorial logic cone output (361) is designed to arrive at transparent latch (308) before CLK (305) transitions from high to low. Transparent latch (308) may update its output OUT 3 (325) while a high signal occurs on CLK (305).

Because transparent latch (302) may modify its output (307) while a low signal occurs on CLK (305), it is a negative polarity state device. Transparent latch (304) modifies its output (309) while a high signal occurs on CLK (305); therefore, it is a positive polarity state device. Transparent latches (302, 304) are associated with the phase A clock, CLK (305). Transparent latch (302), therefore, is in phase B, and transparent latch (304) is in phase A. Combinatorial logic cone (306) may respond to one or both of the inputs. Because transparent latches (302, 304) and their associated outputs (307, 309) are in different phases, combinatorial logic cone (306) is in a mixed phase. Because transparent latch (308) may update its output OUT 3 (325) while a high signal occurs on CLK (305), it is a positive polarity state device. The transparent latch (308) and output OUT 3 (325) are in phase A because it is associated with the phase A clock, CLK (305).

Figure 5B:
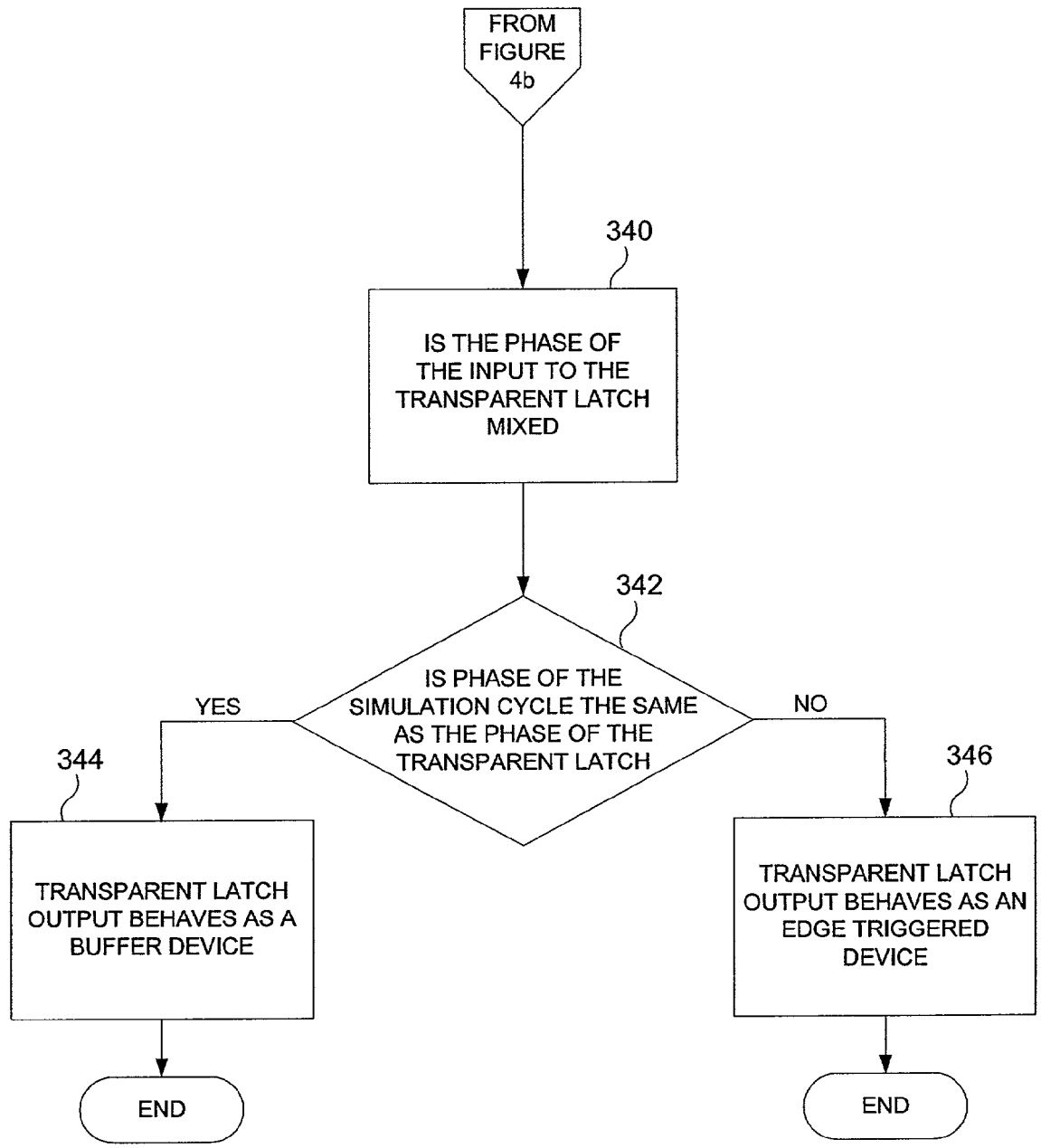
FIG. 5b shows an example flow diagram of classifying a transparent latch that behaves as a buffer device or an edge triggered device depending on the phase of the simulation cycle in accordance with an embodiment of the present invention.

FIG. 5b provides an exemplary flow diagram to model the transparent latch (308 in FIG. 5a) in a cycle-based simulation. In block (340), the phase of the input to transparent latch (308 in FIG. 5a) is in a mixed phase. At (342), due to the above classification of the input to the transparent latch (308 in FIG. 5a), if the current simulation cycle is the phase A simulation cycle, (344) is performed. Conversely, if the current simulation cycle is the phase B simulation cycle, (346) is performed. At (344), the transparent latch (308 in FIG. 5a) is modeled as a buffer device as disclosed above. At (346), the transparent latch (308 in FIG. 5a) is modeled as an edge triggered device as disclosed above.

Those skilled in the art will appreciate that the modeling of the transparent latch (308) is not constant through time. Depending on the simulation cycle phase, the transparent latch (308) may be modeled differently.

Referring again to FIG. 5a, during the phase A simulation cycle (or high CLK (305) state), transparent latch (308) is transparent; therefore, output OUT 3 (325) is equated to combinatorial logic cone output (361). Combinatorial logic cone output (361) may be modified by the input IN 2 (303) to transparent latch (304), and the last output (307) state from transparent latch (302) while CLK (305) was in a low state. Transparent latch (308) functionally operates as a buffer device. During the phase B simulation cycle (or low CLK (305) state), transparent latches (304, 308) are opaque, while transparent latch (302) is transparent. The combinatorial logic cone (306) may modify its output (361) due to input IN 1 (301). Because transparent latch (308) is opaque during this time, no change in OUT 3 (325) occurs. Transparent latch (308) is modeled as an edge triggered device.

Those skilled in the art will appreciate that the definitions of phase A clocks and phase B clocks, phase A and phase B state devices, and the phase A and phase B simulation cycle for transition edges and/or simulation cycle states may be inverted, respectively. Different definitions of a phase does not modify the rules presented in exemplary flow diagrams 3b, 4b, and 5b.

Those skilled in the art will appreciate that simulation instructions have two instruction flows. One flow is for the phase A simulation cycle and the other flow is for the phase B simulation cycle.

Two different approaches for simulation of transparent latches that behave as buffer devices are provided. Edge triggered devices do not need any special approach. As described above, a mixed phase transparent latch behavior can be decomposed into either a buffer device or an edge triggered device in the appropriate phase of the simulation cycle. Transparent latches that behave as buffer devices may follow either on of the following simulation approaches.

First, the simulation may stop propagating a state at the output of the transparent latch. At the end of every simulation cycle, the state at the output of the transparent latch is compared with a previous state (i.e., the state in the simulation cycle previous to the current simulation cycle). If the current state does not equal the previous state at any transparent latch output (i.e., the new state is different from the previous state), an additional simulation cycle without time advancement may be invoked to simulate the design. The additional simulation cycle without time advancement allows the new state to propagate through the simulated circuits and may cause other states to be modified.

This process of additional simulation cycles without time advancement is repeated until all the transparent latch outputs no longer have any change in state. At the conclusion of propagating the modified states until no further changes are observed, the simulation may resume time advancement. Those skilled in the art will appreciate that the additional simulation cycles may be restricted to a small design portion that is affected by the modified transparent latch states.

Second, the transparent latch may be modeled as a simple combinatorial logic gate (e.g., as a buffer device) as discussed above. The simulation may propagate the output of the transparent latch that has been modeled as a buffer device, until the change in state may no longer be modified. Examples of devices that may not propagate the change in state include a combinatorial logic cone that does not logically respond to an input. Other devices include a state device, such as an edge triggered device or flip flop, that does not propagate the state.

Those skilled in the art will appreciate that either simulation approach may be used. Either approach may be used within the same simulation.

Multiple clock source simulations (multiple clock domain designs) are also supported by the above described classification and modeling rules. The above concepts and algorithm may be extended to compile a multiple clock domain design. If a design has N clock sources, there may be $2^N$ clock phases in the design. Each clock phase represents a unique combination of the clock sources. A compiler may statically determine for every transparent latch whether the transparent latch is transparent or opaque in that clock phase.

Figure 6:
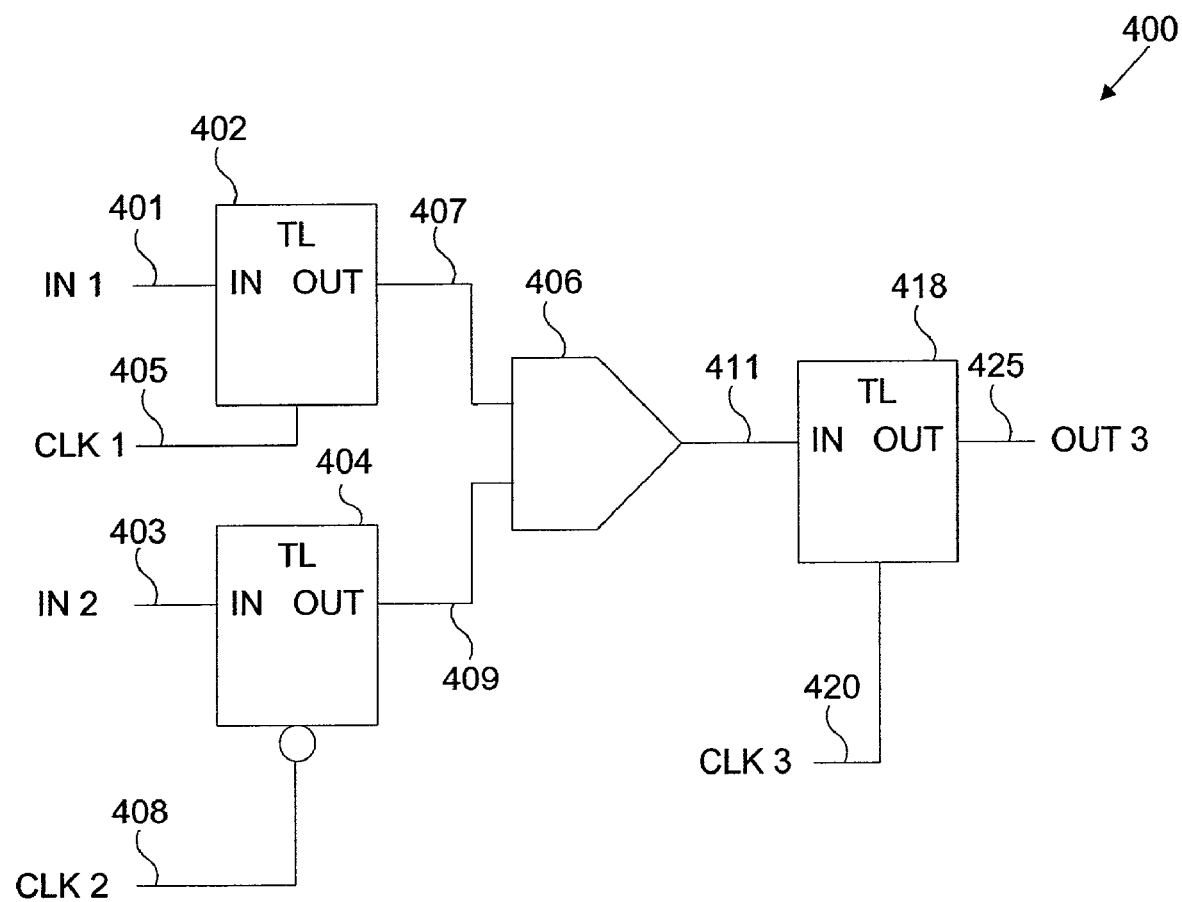
FIG. 6 shows an example circuit diagram of a transparent latch driven by source latches using different clock domains in accordance with an embodiment of the present invention.

For example, an exemplary circuit diagram (400) is shown in FIG. 6. Three clock sources exist; therefore, there may be 8 clock phases to represent all the combinatorial clock states. All 8 clock phases and their association to each state of the clock sources is listed in Table 1 in FIG. 7a. Those skilled in the art will appreciate that the clock phase associated with each of the clock sources may be assigned differently; however, once the clock phases are assigned, they must be consistently applied.

In FIG. 6, the transparency of transparent latch (418) may be determined. The circuit diagram (400) is representative of a circuit that may require cycle-based simulation. Transparent latch (402) may update its output (407) with its input IN 1 (401) while a high signal occurs on CLK 1 (405). Transparent latch (404) may update its output (409) with its input IN 2 (403) while a low signal occurs on CLK 2 (408). The outputs (407, 409) are inputs into combinatorial logic cone (406). Combinatorial logic cone output (411) is designed to arrive at transparent latch (418) before CLK 3 (420) transitions from low to high. Transparent latch (418) may update its output OUT 3 (425) while a high signal occurs on CLK 3 (420).

The transparent latch (402) may modify its output (407) while a high signal occurs on CLK 1 (405). Transparent latch (402) is active (transparent) in phases 1, 2, 3, and 5. The transparent latch (404) may modify its output (409) while a low signal occurs on CLK 2 (408). Transparent latch (404) is active (transparent) in phases 3, 5, 7, and 8. The output (411) of combinatorial logic cone (406) may be marked as phases 1, 2, 3*, 5*, 7, and 8 to indicate which phases may result in a change in the output (411). Also, the output (411) may change in phases 3 and 5 as a result of both inputs (407, 409). The remaining marked phases may change as a result of only one of the inputs (407, 409).

The transparent latch (418) may modify its output (425) while a high signal occurs on CLK 3 (420). Transparent latch (418) is active (transparent) in phases 1, 3, 4, and 7. Because the output (411) of combinatorial logic cone (406) is marked as phases 1, 2, 3*, 5*, 7, and 8 and is the input to transparent latch (418), the transparent latch (418) can be modeled as a buffer device in phase 3, mixed phase transparent latch in phases 1 and 7, and as an edge triggered device in phases 2, 4, 5, 6, and 8.

By applying the modeling rules from flow diagrams 3b, 4b, and 5b, the state of OUT 3 (425) may be statically determined based on the states of IN 1 (401), IN 2 (403), and the clock phases. Table 2 in FIG. 7b shows the results of modeling transparent latch (418) with respect to each clock phase. For example, in clock phase 1, a high signal occurs on all three clock sources. The data flow from transparent latch (402) through transparent latch (418) is transparent. The flow from transparent latch (404) through transparent latch (418) is opaque. In clock phase 1, transparent latch (418) may be modeled as a mixed phase device. Because in clock phase 2 both data flows are opaque, the transparent latch (418) may be modeled as an edge triggered device. Because in clock phase 3 both data flows are transparent, the transparent latch (418) may be modeled as a buffer device.

Those skilled in the art will appreciate that the transparent or opaque nature of any transparent latch in a design may be determined specifically and statically for a simulation cycle phase. The modeling rules described above may be applied to transparent latches for cycle-based simulation.

Multiple clock domain designs (N domains) may follow the above rules. Obviously, an N clock domain system may be modeled using a $2^N$ clock phase table. The rules, however, may be applied to N independent design sections. In clock domains that are independent, the data flow between the clock domains is controlled using a traditional cycle-based design elements. For example, the data flow between two clock domains may be controlled by flip-flops (as opposed to a transparent latch). If independent clock domains exist, the above rules may be independently applied to each independent clock domain. The overhead and complexity associated with a $2^N$ clock phase table may be reduced by using multiple, smaller-sized clock phase tables.

Figure 8:
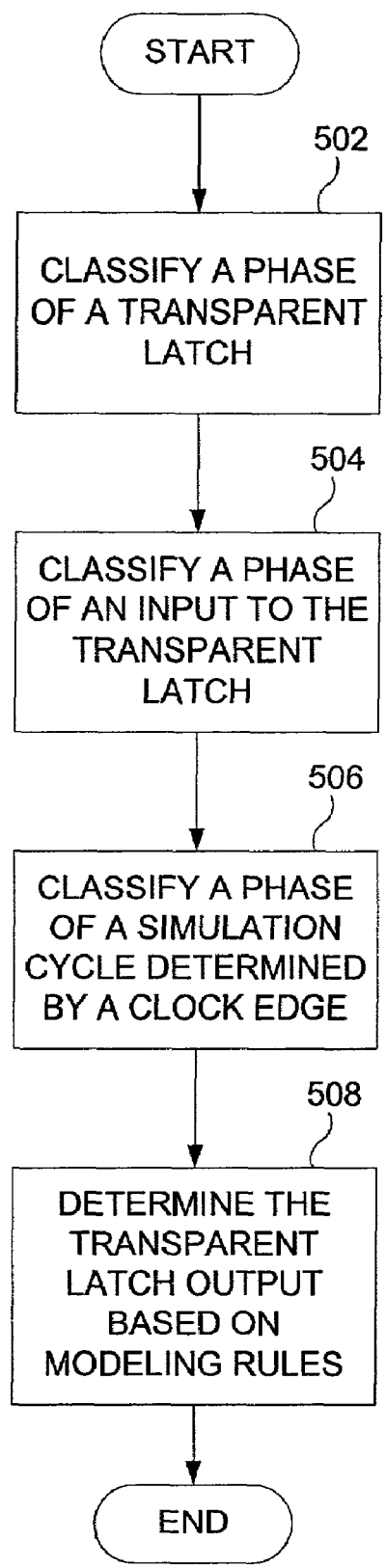
FIG. 8 shows a flow diagram in accordance with an embodiment of the present invention.

FIG. 8 shows an exemplary flow diagram that encapsulates the flow diagrams shown in FIGS. 3b, 4b, and 5b. At (502), a phase of a transparent latch that is being modeled is classified. The transparent latch phase is based on the positive or negative polarity of the transparent latch and the phase of the associated clock input to the transparent latch.

At (504), a phase of an input to the transparent latch is classified. The input to the transparent latch may come from a combinatorial logic cone, a logic element, or any input from the system. As defined above, a combinatorial logic cone may include any combination of combinatorial logic elements. Combinatorial logic elements include, but are not limited to, any elements that provide Boolean logic functionality.

The input to the transparent latch may also be a logic element. Logic elements include, but are not limited to, any elements that provide Boolean logic functionality, state devices that maintain the state of some part of the system for a limited time, and memory storage elements. Combinatorial logic cones and logic elements may depend on inputs that are controlled by state devices. State devices include, but are not limited to, transparent latches, flip flops, and edge triggered devices. Combinatorial logic cones and logic elements may be classified based on a phase of their associated state devices that control the inputs to the combinatorial logic cones and logic elements. The phase of an associated state device may depend on a phase of a clock input to the state device and a polarity of the state device.

At (506), a phase of a simulation cycle is determined based on a clock edge. For example in a single clock domain design, a low to high clock transition may be referred to as the phase A simulation cycle. A high to low clock transition may be referred to as the phase B simulation cycle. In a multiple clock domain design, multiple clock phases may be assigned based on a combination of multiple clock sources.

At (508), the modeling rules are applied to the transparent latch. The rules may be statically determined and applied in single and multiple clock domain designs. As described above, the transparent latch behaves as a buffer during simulation if the phase of the transparent latch is the same as the phase of the input to the transparent latch. The transparent latch behaves as an edge triggered device during simulation if the phase of the transparent latch is the opposite of the phase of the input to the transparent latch. The transparent latch behaves as a buffer during simulation if the phase of the simulation cycle is the same as the phase of the transparent latch and as an edge triggered device during simulation if the phase of the simulation cycle is the opposite of the phase of the transparent latch when the phase of the input to the transparent latch is mixed.

Advantages of the present invention may include one or more of the following. The invention provides cycle-based simulation to elements (i.e., transparent latches) that do not generally follow cycle-based simulation methodologies. The present invention provides a method to simulate transparent latches in a cycle-based simulation. The invention provides cycle-based simulation of a design that uses transparent latches without requiring modification of the design to allow cycle-based simulation. The invention allows a design to keep the transparent latches, as is possible in an event driven simulation, while enabling the advantages of cycle-based simulation.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system for cycle-based simulation of a transparent latch, comprising:
 a processor;
 a memory; and
 software instructions stored in the memory adapted to cause the computer system to perform:
  classifying a phase of the transparent latch;
  classifying a phase of an input to the transparent latch;
  classifying a phase of a simulation cycle;
  determining a cycle-based simulation element corresponding to a combination of said phases; and subsequently
  simulating the transparent latch with the cycle-based simulation element,
  wherein the cycle-based simulation element simulating the transparent latch is a buffer if, when the phase of the input to the transparent latch is mixed, the phase of the simulation cycle is the same as the phase of the transparent latch, and
  wherein the cycle-based simulation element simulating the transparent latch is an edge triggered device if, when the phase of the input to the transparent latch is mixed, the phase of the simulation cycle is the opposite of the phase of the transparent latch.

2. The computer system of claim 1, wherein the phase of the transparent latch depends on a phase of a clock input to the transparent latch and a polarity of the transparent latch.

3. The computer system of claim 1, wherein classifying the phase of the input to the transparent latch comprises classifying a phase of a combinatorial logic cone.

4. The computer system of claim 3, wherein classifying the phase of the combinatorial logic cone comprises classifying a phase of an input to a combinatorial logic element.

5. The computer system of claim 4, wherein classifying the phase of the input to the combinatorial logic element comprises classifying a phase of a state device associated with the combinatorial logic element.

6. The computer system of claim 5, wherein the phase of the state device depends on a phase of a clock input to the state device and a polarity of the state device.

7. The computer system of claim 1, wherein classifying the phase of the input to the transparent latch comprises classifying a phase of a logic element.

8. The computer system of claim 1,
 wherein the cycle-based simulation element simulating the transparent latch is a buffer if the phase of the transparent latch is the same as the phase of the input to the transparent latch.

9. The computer system of claim 1,
 wherein the cycle-based simulation element simulating the transparent latch is an edge triggered device if the phase of the transparent latch is the opposite of the phase of the input to the transparent latch.

10. The computer system of claim 1, wherein if the cycle-based simulation element simulating the transparent latch is a buffer, then simulating the transparent latch comprises performing an additional simulation cycle without simulating time advancement.

11. The computer system of claim 10, wherein performing the additional simulation cycle propagates a state change.

12. The computer system of claim 1, wherein if the cycle-based simulation element simulating the transparent latch is a buffer, then simulating the transparent latch comprises simulating the transparent latch as a combinatorial logic element.

13. The computer system of claim 1, wherein the combination of the phase of the transparent latch, the phase of the input to the transparent latch, and the phase of the simulation cycle depends on a plurality of clock sources.

14. An apparatus for cycle-based simulation of a transparent latch, comprising:
 means for classifying a phase of the transparent latch;
 means for classifying a phase of an input to the transparent latch;
 means for classifying a phase of a simulation cycle;
 means for determining a cycle-based simulation element corresponding to a combination of said phases, wherein the cycle-based simulation element is:
  a buffer if the phase of the transparent latch is the same as the phase of the input to the transparent latch;
  an edge triggered device if the phase of the transparent latch is the opposite of the phase of the input to the transparent latch;
  a buffer if, when the phase of the input to the transparent latch is mixed, the phase of the simulation cycle is the same as the phase of the transparent latch;
  an edge triggered device if, when the phase of the input to the transparent latch is mixed, the phase of the simulation cycle is the opposite of the phase of the transparent latch; and
 means for simulating the transparent latch as the cycle-based simulation element.

* * * * *